(12) United States Patent
Fujita et al.

(10) Patent No.: US 7,795,158 B2
(45) Date of Patent: Sep. 14, 2010

(54) OXIDATION METHOD AND APPARATUS FOR SEMICONDUCTOR PROCESS

(75) Inventors: Takehiko Fujita, Nirasaki (JP); Jun Ogawa, Nirasaki (JP); Shigeru Nakajima, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 419 days.

(21) Appl. No.: 11/892,949

(22) Filed: Aug. 28, 2007

(65) Prior Publication Data

US 2008/0057199 A1 Mar. 6, 2008

(30) Foreign Application Priority Data

Sep. 1, 2006 (JP) .............................. 2006-237559

(51) Int. Cl.
*H01L 21/31* (2006.01)
*H01L 21/469* (2006.01)

(52) U.S. Cl. ............... 438/770; 118/715; 257/E21.283; 257/E21.301; 438/773; 438/777; 438/787; 438/788

(58) Field of Classification Search .......... 257/E21.283, 257/E21.301; 438/770, 773, 777, 787, 788
See application file for complete search history.

(56) References Cited

U.S. PATENT DOCUMENTS 6,146,135 A * 11/2000 Watanabe et al. ............ 432/221

6,949,478 B2 * 9/2005 Ohmi et al. .................. 438/774
2005/0196533 A1 * 9/2005 Hasebe et al. ............ 427/248.1
2007/0157882 A1    7/2007 Ozaki et al.

FOREIGN PATENT DOCUMENTS

| CN | 1762043 | 4/2006 |
|---|---|---|
| JP | 57-001232 | 1/1982 |
| JP | 03-140453 | 6/1991 |
| JP | 04-018727 | 1/1992 |
| JP | 2004-022833 | 1/2004 |
| JP | 2005-175441 | 6/2005 |
| JP | 2005-277386 | 10/2005 |

OTHER PUBLICATIONS

Office Action for Application No. 200710147862.7 issued by Patent Office of The People's Republic of China on Feb. 5, 2010. Also enclosed is a partial English translation thereof.

* cited by examiner

*Primary Examiner*—Asok K Sarkar
(74) *Attorney, Agent, or Firm*—Smith, Gambrell & Russell, LLP

(57) ABSTRACT

In an oxidation method for a semiconductor process, target substrates are placed at intervals in a vertical direction within a process field of a process container. An oxidizing gas and a deoxidizing gas are supplied to the process field from one side of the process field while gas is exhausted from the other side. One or both of the oxidizing gas and the deoxidizing gas are activated. The oxidizing gas and the deoxidizing gas are caused to react with each other, thereby generating oxygen radicals and hydroxyl group radicals within the process field. An oxidation process is performed on the surfaces of the target substrate by use of the oxygen radicals and the hydroxyl group radicals.

11 Claims, 9 Drawing Sheets

OXIDATION METHOD AND APPARATUS FOR SEMICONDUCTOR PROCESS

BACKGROUND OF THE INVENTION

1. Field of the Invention

The present invention relates to an oxidation method and apparatus for a semiconductor process for oxidizing the surface of a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor integrated circuits, a semiconductor substrate, such as a silicon wafer, is subjected to various processes, such as film formation, etching, oxidation, diffusion, and reformation, in general. For example, oxidation includes oxidation of the surface of a mono-crystalline silicon film or a poly-crystalline silicon film, and oxidation of a metal film. Particularly, a silicon oxide film formed by oxidation is applied to a device isolation film, gate oxide film, capacitor insulating film, or the like.

As regards methods for performing an oxidation process, where locking at them by the type of pressure, there is a normal-pressure oxidation method, in which the atmosphere inside a process container is set to be almost equal to atmospheric pressure. Further, there is a low-pressure oxidation method, in which the atmosphere inside a process container is set to be a vacuum. Where looking at them by the type of gas used for oxidation, there is a wet oxidation method, in which, for example, hydrogen and oxygen are burnt in an external combustion apparatus to generate water vapor, so as to perform oxidation by use of the water vapor (for example, Jpn. Pat. Appln. KOKAI Publication No. 3-140453 (Patent Document 1)). Further, there is a dry oxidation method, in which ozone or oxygen is solely supplied into a process container to perform oxidation without using water vapor (for example, Jpn. Pat. Appln. KOKAI Publication No. 57-1232 (Patent Document 2)).

As described above, oxidation can be performed by dry oxidation that employs oxygen gas, or wet oxidation that employs water vapor. In general, an oxide film formed by wet oxidation is higher in film quality than an oxide film formed by dry oxidation. Accordingly, in consideration of film properties, such as breakdown voltage, corrosion resistance, and reliability, a wet oxide film is better as an insulating film. On the other hand, the film formation rate of an oxide film (insulating film) to be formed and the planar uniformity therein on a wafer are also important factors. In this respect, a film formed by wet oxidation under a normal pressure shows a high oxidation rate, but shows poor planar uniformity in film thickness, in general. By contrast, a film formed by wet oxidation under a vacuum pressure shows a low oxidation rate, but shows good planar uniformity in film thickness.

Where the design rule of semiconductor devices or semiconductor integrated circuits is not so strict, various oxidation methods as those described above are selectively used, in consideration of, e.g., the intended purpose of oxide films, process conditions, and apparatus cost. On the other hand, in recent years, the line width and film thickness of semiconductor devices have decreased, and thus the design rule has become stricter. This tendency has given rise to demands on better planar uniformity in the quality and thickness of oxide films. However, conventional oxidation methods are now becoming inadequate as regards, because they cannot sufficiently fulfill the demands.

Under the circumstances, there has been proposed an oxidation apparatus, in which $H_2$ gas and $O_2$ gas are independently supplied into a process container and are caused to react with each other inside the process container to generate water vapor, thereby oxidizing a wafer surface (for example, Jpn. Pat. Appln. KOKAI Publication No. 4-18727, Jpn. Pat. Appln. KOKAI Publication No. 2004-22833, Jpn. Pat. Appln. KOKAI Publication No. 2005-277386, and Jpn. Pat. Appln. KOKAI Publication No. 2005-175441 (Patent Documents 3, 4, 5, and 6)).

In the case of techniques disclosed in Patent Documents 3, 5, and 6, where an oxide film is formed, $H_2$ gas and $O_2$ gas are caused to react with each other under a low pressure of about 1 Torr and a relatively low temperature of, e.g., lower than 900° C. to generate oxygen radicals and hydroxyl group radicals. These radicals are used to oxidize a wafer surface, so as to form, e.g., a silicon oxide film.

BRIEF SUMMARY OF THE INVENTION

An object of the present invention is to provide an oxidation method and apparatus for a semiconductor process, which can suppress a large decrease in radical consumption rate, without an increase in gas flow rate.

According to a first aspect of the present inventions there is provided an oxidation method for a semiconductor process comprising: placing a plurality of target substrates at intervals in a vertical direction within a process field of a process container; supplying an oxidizing gas and a deoxidizing gas to the process field respectively through first and second gas supply ports disposed adjacent to the target substrates on one side of the process field, each of the first and second gas supply ports being present over a length corresponding to the process field in a vertical direction; activating one or both of the oxidizing gas and the deoxidizing gas; exhausting gas from the process field through an exhaust port disposed opposite to the first and second gas supply ports with the process field interposed therebetween, thereby causing the oxidizing gas and the deoxidizing gas to flow along surfaces of the target substrates; causing the oxidizing gas and the deoxidizing gas to react with each other, thereby generating oxygen radicals and hydroxyl group radicals within the process field; and performing an oxidation process on the surfaces of the target substrate by use of the oxygen radicals and the hydroxyl group radicals.

According to a second aspect of the present invention, there is provided an oxidation apparatus for a semiconductor process comprising: a process container having a process field configured to accommodate a plurality of target substrates at intervals in a vertical direction; a gas supply system configured to supply an oxidizing gas and a deoxidizing gas to the process field respectively through first and second gas supply ports disposed adjacent to the target substrates on one side of the process field, each of the first and second gas supply ports being present over a length corresponding to the process field in a vertical direction; an exciting mechanism configured to activate one or both of the oxidizing gas and the deoxidizing gas; and an exhaust system configured to exhaust gas from the process field through an exhaust port disposed opposite to the first and second gas supply ports with the process field interposed therebetween, wherein the oxidizing gas and the deoxidizing gas are caused to react with each other, thereby generating oxygen radicals and hydroxyl group radicals within the process field, and an oxidation process is performed on the surfaces of the target substrate by use of the oxygen radicals and the hydroxyl group radicals.

According to a third aspect of the present invention, there is provided a computer readable medium containing program instructions for execution on a processor, wherein the program instructions, when executed by the processor, control an oxidation apparatus for a semiconductor process to conduct an oxidation method comprising: placing a plurality of target substrates at intervals in a vertical direction within a process field of a process container; supplying an oxidizing gas and a deoxidizing gas to the process field respectively through first and second gas supply ports disposed adjacent to the target substrates on one side of the process field, each of the first and second gas supply ports being present over a length corresponding to the process field in a vertical direction; activating one or both of the oxidizing gas and the deoxidizing gas; exhausting gas from the process field through an exhaust port disposed opposite to the first and second gas supply ports with the process field interposed therebetween, thereby causing the oxidizing gas and the deoxidizing gas to flow along surfaces of the target substrates; causing the oxidizing gas and the deoxidizing gas to react with each other, thereby generating oxygen radicals and hydroxyl group radicals within the process field; and performing an oxidation process on the surfaces of the target substrate by use of the oxygen radicals and the hydroxyl group radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
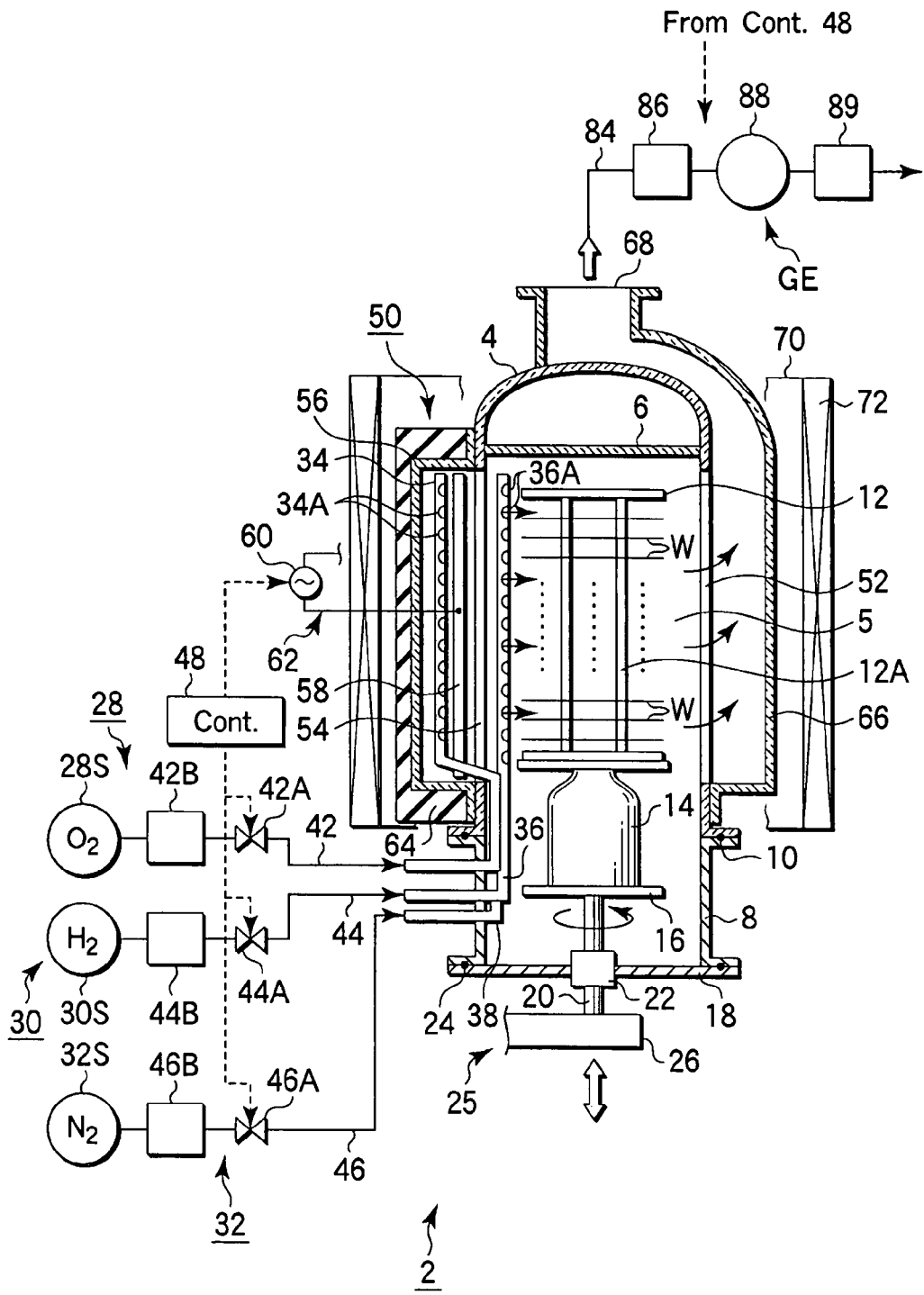
FIG. 1 is a sectional view showing a vertical plasma processing apparatus (oxidation apparatus) according to an embodiment of the present invention.

In the process of developing the present invention, the inventors studied problems of conventional techniques for semiconductor processes, in relation to a method of forming an oxide film by oxidation. As a result, the inventors have arrived at the findings given below.

In an oxidation method for oxidizing a wafer surface by causing $H_2$ gas and $O_2$ gas to react with each other under a low pressure, various activated species (radicals) generated by reactions have very high reactivity. In this case, oxidation proceeds without reference to the orientation of crystal planes exposed on the wafer surface, i.e., without dependency on the orientation of crystal planes. Consequently, even where ragged patterns are present on the wafer surface, an oxide film is formed with a uniform film thickness along the surface of ragged patterns. Further, since radicals are very reactive, a film difficult to oxidize, i.e., an oxidation resistant film, such as a silicon nitridation film, can be oxidized.

However, in spite of the advantages described above, the consumption of radicals significantly fluctuates depending on the pattern surface area and/or film type on a wafer surface to be oxidized. Accordingly, process conditions, such as gas flow rates, need to be optimized to compensate for the fluctuation. In this case, it is necessary to obtain optimized process conditions, such as gas flow rates, in advance in accordance the pattern surface area and/or film type. However, obtaining optimized process conditions, such as gas flow rates, requires adjustment operations that are very troublesome. Particularly, in recent years, the semiconductor industry has a trend of large item small volume production. This trend diversifies the pattern surface area and/or film type on a wafer surface, and thus requires a number of adjustment operations to optimize various conditions.

Further, it is preferable to suppress fluctuation of radicals due to consumption of the radicals, so as to simplify adjustment operations for this optimization. For example, in an oxidation apparatus of the butch type for treating a number of wafers all together, there is a case where the flow rates of $H_2$ gas and $O_2$ gas are increased to generate a number of radicals. In this case, since radicals are excessively generated, the wafers W are supplied with sufficient radicals, and adjustment operations of process conditions can be simplified.

However, since a certain time lag is present between the gas supply and the ignition of a combustion reaction, the residence time of the gases is decreased where large amounts of gases are supplied. Consequently, the ignition of a combustion reaction is delayed, and the oxidation rate on the wafer surface may become less uniform between wafers. Further, where large amounts of gases are supplied, as described above, the hydrogen concentration in an oxide film becomes higher and deteriorates the film qualities, such as the breakdown voltage being lower.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
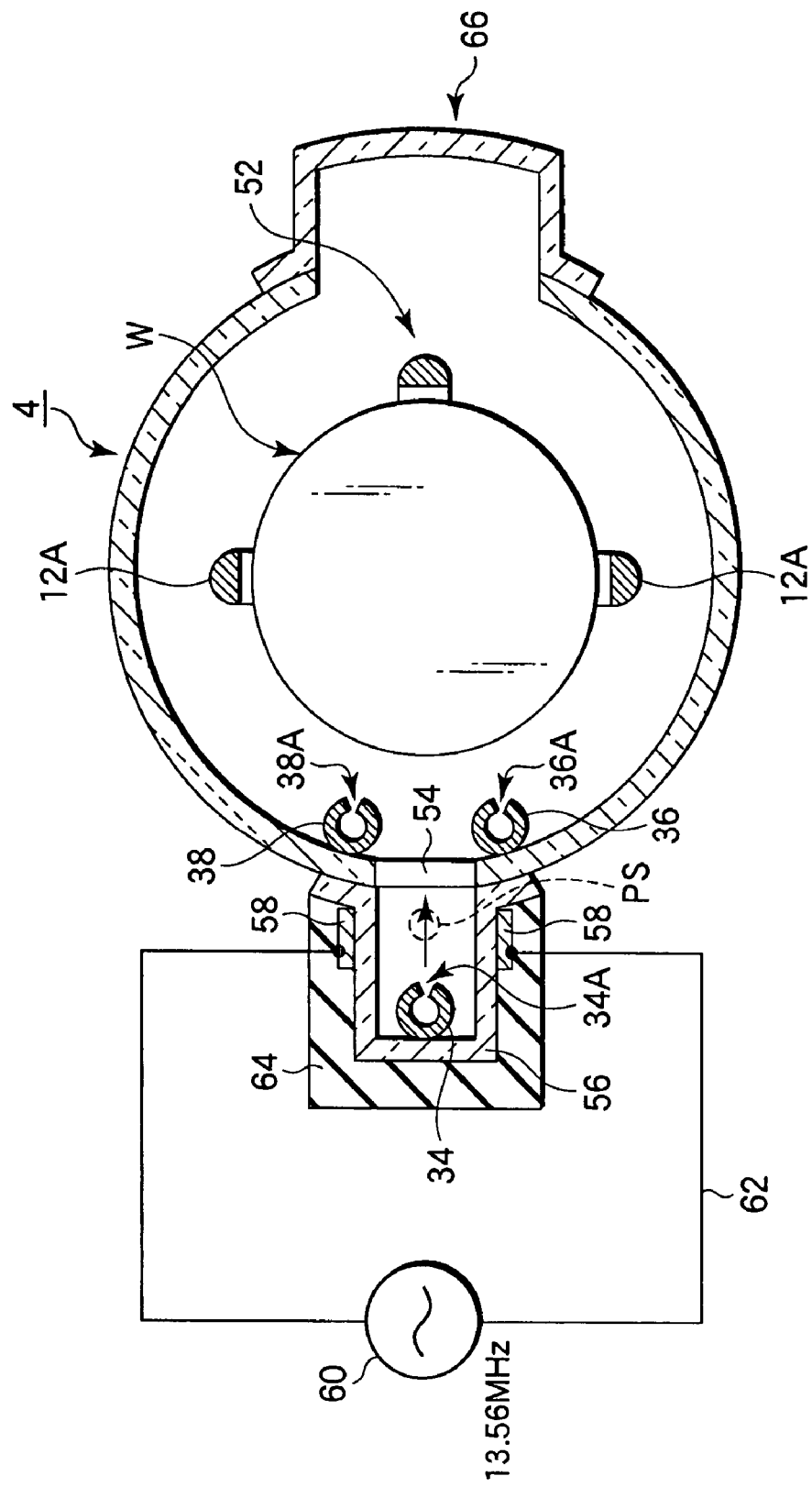
FIG. 2 is a sectional plan view showing part of the apparatus shown in FIG. 1.

FIG. 1 is a sectional view showing a vertical plasma processing apparatus (oxidation apparatus) according to an embodiment of the present invention. FIG. 2 is a sectional plan view showing part of the apparatus shown in FIG. 1. The oxidation apparatus 2 has a process field configured to be selectively supplied with an oxidizing gas, such as $O_2$ gas, a deoxidizing gas, such as $H_2$ gas, and an inactive gas, such as $N_2$ gas. The oxidation apparatus 2 is configured to oxidize the surface of target substrates, such as semiconductor wafers, in the process field.

The oxidation apparatus 2 includes a process container (reaction chamber) 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes an oxidizing gas supply circuit 28, a deoxidizing gas supply circuit 30, and an inactive gas supply circuit 32. The oxidizing gas supply circuit 28 is arranged to supply an oxidizing gas, such as $O_2$ gas. In place of $O_2$ gas, ozone that is more reactive may be used. The deoxidizing gas supply circuit 30 is arranged to supply a deoxidizing gas, such as $H_2$ gas. The inactive gas supply circuit 32 is arranged to supply an inactive gas, such as $N_2$ gas, as a purge gas or an inactive gas for adjusting pressure. Each of the oxidizing and deoxidizing gases may be mixed with a suitable amount of carrier gas, as needed. However, such a carrier gas will not be mentioned, hereinafter, for the sake of simplicity of explanation.

More specifically, the oxidizing gas supply circuit 28, deoxidizing gas supply circuit 30, and inactive gas supply circuit 32 include gas distribution nozzles 34, 36, and 38, respectively, each of which is formed of a quartz pipe which penetrates the sidewall of the manifold 8 from the outside and then turns and extends upward (see FIG. 2). The gas distribution nozzles 34, 36, and 38 respectively have a plurality of gas spouting holes 34A, 36A, and 38A, each set being formed at predetermined intervals in the longitudinal direction (the vertical direction) over all the wafers W on the wafer boat 12.

The nozzles 34, 36, and 38 are connected to gas sources 28S, 30S, and 32S of $O_2$ gas, $H_2$ gas, and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $O_2$ gas, $H_2$ gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4. The cover 56 has a vertically long and thin shape with a concave cross-section, so that it projects outward from the process container 4.

With this arrangement, the gas exciting section 50 is formed such that it projects outward from the sidewall of the process container 4 and is connected on the other side to the interior of the process container 4. In other words, the inner space of the gas exciting section 50 communicates through the opening 54 with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other while extending in the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the oxidizing gas is bent outward in the radial direction of the process container 4 at a position lower than the lowermost wafer W on the wafer boat 12. Then, the gas distribution nozzle 34 vertically extends at the deepest position (the farthest position from the center of the process container 4) in the gas exciting section 50. As also shown in FIG. 2, the gas distribution nozzle 34 is separated outward from an area sandwiched between the pair of electrodes 58 (a position where the RF electric field is most intense), i.e., a plasma generation area PS where the main plasma is actually generated. The oxidizing gas comprising $O_2$ gas is spouted from the gas spouting holes 34A of the gas distribution nozzle 34 toward the plasma generation area PS.

Then, the oxidizing gas is excited (decomposed or activated) in the plasma generation area PS, and is supplied in this state through the opening 54 onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 38 of the deoxidizing gas and inactive gas extend upward and face each other at positions near and outside the opening 54 of the gas exciting section 50, i.e., on both sides of the outside of the opening 54 (in the process container 4). The deoxidizing gas comprising $H_2$ gas and the inactive gas comprising $N_2$ gas are spouted from the gas spouting holes 36A and 38A of the gas distribution nozzles 36 and 38, respectively, toward the center of the process container 4. The gas spouting holes 36A and 38A are formed at positions between the wafers W on the wafer boat 12 to respectively deliver the deoxidizing gas ($H_2$) and inactive gas ($N_2$) essentially uniformly in the horizontal direction, so as to form gas flows parallel with the wafers W.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust port cover member 66 extends upward along the sidewall of the process container 4, and has a gas outlet 68 at the top of the process container 4. The gas outlet 68 is connected to a vacuum-exhaust system GE including a vacuum pump and so forth. The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side.

The process container 4 is surrounded, by a casing 70. The casing 70 is provided with a heater 72 on the inner surface for heating the atmosphere and wafers W inside the process container 4. For example, the heater 72 is formed of a carbon wire, which causes no contamination and has good characteristics for increasing and decreasing the temperature. A thermocouple (not shown) is disposed near the exhaust port 52 in the process container 4 to control the heater 72.

The oxidation apparatus 2 further includes a main control section 48 formed of, e.g., a computer, to control the entire apparatus. The main control section 48 can control the oxidation process described below in accordance with the process recipe of the oxidation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 72, and so forth, based on the stored process recipe and control data.

Figure 11:
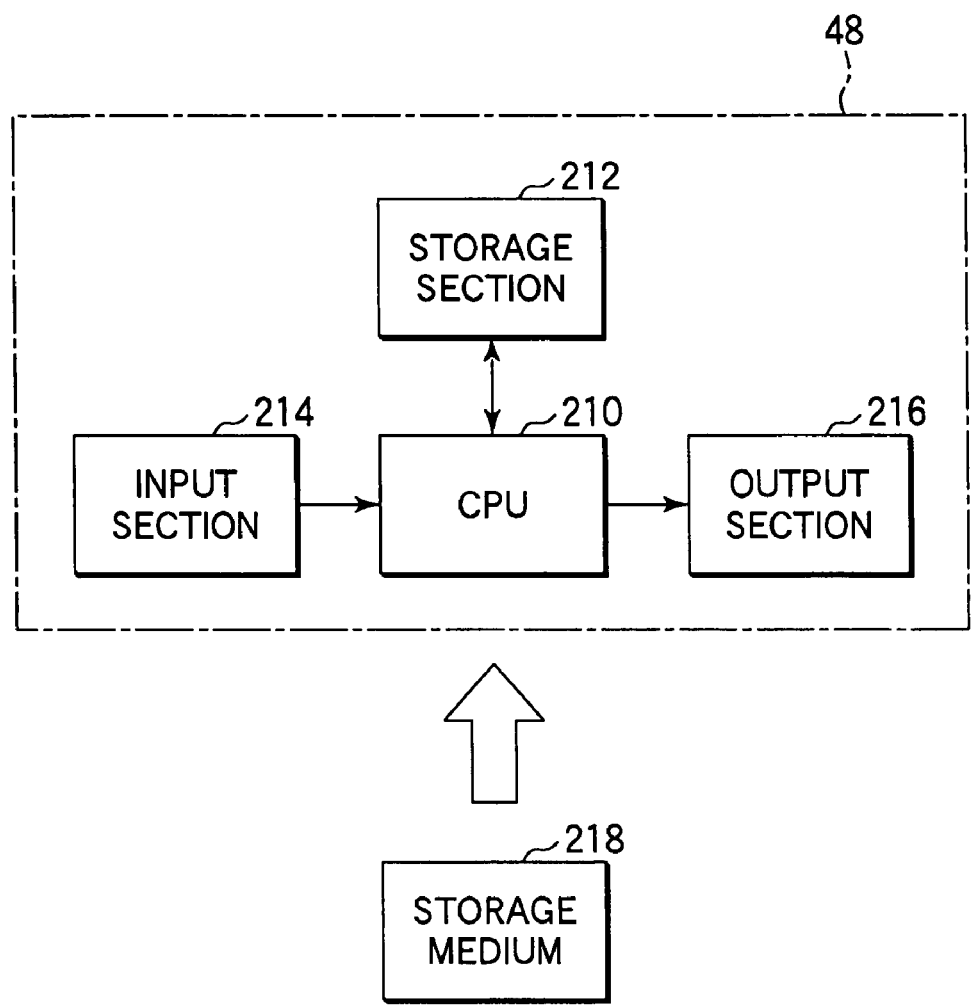
FIG. 11 is a block diagram schematically showing the structure of a main control section used in the apparatus shown in FIG. 1.

FIG. 11 is a block diagram schematically showing the structure of the main control section 48 of the apparatus shown in FIG. 1. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 11 also shows a storage medium 218 attached to the computer in a removable state.

The oxidation method described below may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described below.

Figure 3:
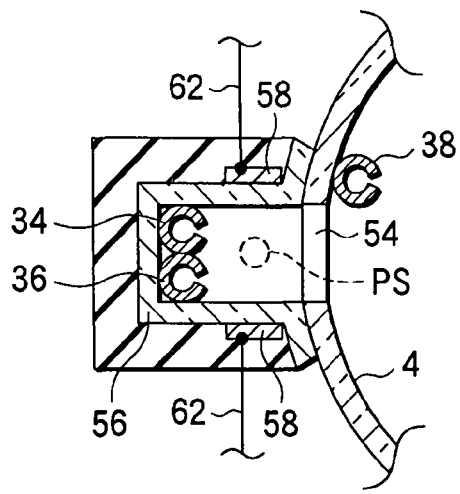
FIG. 3 is a sectional plan view showing part of a modification of the apparatus shown in FIG. 1.

FIG. 3 is a sectional plan view showing part of a modification of the apparatus shown in FIG. 1. The present invention includes a process utilizing activation of the deoxidizing gas containing $H_2$, as well as activation of the oxidizing gas containing $O_2$, while using the structure shown in FIG. 3. For this purpose, the modification shown in FIG. 3 is arranged such that the gas distribution nozzle 36' of the deoxidizing gas is located adjacent to the gas distribution nozzle 34 of the oxidizing gas. Specifically, the gas distribution nozzle 36' of the deoxidizing gas is bent outward in the radial direction of the process container 4, at a position lower than the lowermost wafer W on the wafer boat 12. Then, the gas distribution nozzle 36' vertically extends at the deepest position (the farthest position from the center of the process container 4) in the gas exciting section 50. As shown also in FIG. 3, the gas distribution nozzle 36' is separated outward from an area sandwiched between the pair of electrodes 58 (a position where the RF electric field is most intense), i.e., the plasma generation area PS where the main plasma is actually generated. The deoxidizing gas containing $H_2$ gas is spouted from the gas spouting holes 36A of the gas distribution nozzle 36' toward the plasma generation area PS. Then, the deoxidizing gas is excited (decomposed or activated) in the plasma generation area PS, and is supplied in this state onto the wafers W on the wafer boat 12.

Next, an explanation will be given of an oxidation method performed in the apparatus shown in FIG. 1. In summary, this oxidation method is arranged to supply an oxidizing gas comprising $O_2$ gas and a deoxidizing gas comprising $H_2$ gas to the process field 5 accommodating wafers W, while exhausting gas from the process field 5. One or both of the oxidizing gas and deoxidizing gas are supplied into the process field 5 while being activated by the gas exciting section 50. The oxidizing gas and deoxidizing gas are caused to react with each other to generate oxygen radicals and hydroxyl group radicals inside the process field 5, thereby performing an oxidation process on the surface of the wafers W.

At first, the wafer boat 12 at room temperature, which supports a number of, e.g., 50 to 100, wafers having a diameter of 300 mm, is loaded into the process container 4 heated at a predetermined temperature. The wafers are formed of, e.g., silicon substrates with a silicon or silicon oxide film exposed all over or partly on the surface, as an oxidation target. Then, the interior of the process container 4 is vacuum-exhausted and kept at a predetermined process pressure, and the wafer temperature is increased to a process temperature for oxidation. The apparatus is in a waiting state until the temperature becomes stable. Then, the oxidizing gas comprising $O_2$ gas and the deoxidizing gas comprising $H_2$ gas are supplied from the gas distribution nozzles 34 and 36 at controlled flow rates. At this time, while the wafer boat 12 is rotated, silicon on the surface of the wafers W supported on the wafer boat 12 is oxidized to form a silicon oxide film ($SiO_2$).

The deoxidizing gas comprising $H_2$ gas is supplied from the gas spouting holes 36A of the gas distribution nozzle 36 to form gas flows parallel with the wafers W on the wafer boat 12. On the other hand, the oxidizing gas comprising $O_2$ gas is supplied from the gas spouting holes 34A of the gas distribution nozzle 34 to form horizontal gas flows toward the opening 54. The oxidizing gas is selectively excited and partly turned into plasma when it passes through the plasma generation area PS between the pair of electrodes 58. At this time, oxygen radicals O* (activated species) are produced (the symbol [*] denotes that it is a radical). The radicals flow out from the opening 54 of the gas exciting section 50 toward the center of the process container 4, and are supplied into gaps between the wafers W in a laminar flow state.

The $H_2$ gas and the $O_2$ gas containing oxygen radicals thus individually supplied into the process container 4 perform a combustion reaction while diffusing. In the process of this reaction, oxygen radicals (O*), hydroxyl group radicals (OH*), and water vapor ($H_2O$) are generated, by which silicon on the wafer surface is oxidized to form a silicon oxide film. As described above, reactive oxygen radicals are generated by use of plasma and are then used for a combustion reaction to generate radicals necessary for oxidation. Consequently, a large number of oxygen radicals can be generated as a whole and then contribute to oxidation of the wafer surface, so that an oxide film is formed at a high rate.

In the conventional apparatus, while gas flows from an upstream side to a downstream side inside the process field, radicals are gradually consumed for performing oxidation. In this case, depending on the pattern shape (surface area) and film type on the wafer surface, the consumption of radicals tends to significantly fluctuate. Consequently, in order to maintain high reproducibility in film thickness, very complicate adjustment operations need to be performed in advance, so that optimized process conditions, such as gas flow rates, are obtained in accordance with the pattern surface area and/or film type on the wafer surface.

However, as described above, the method according to this embodiment is arranged to generate oxygen radicals by use of plasma on an upstream side of the gas flow, in addition to generation of radicals by use of a combustion reaction. In this case, since a large number of radicals (oxygen radicals) can be used, the relative value of the fluctuation rate of radicals is decreased. Consequently, even where the pattern surface area and/or film type on the wafer surface are changed as described above, adjustment operations for process conditions become less necessitated. In other words, it is possible to simplify adjustment operations in obtaining optimized process conditions, such as gas flow rates.

Further, where $O_2$ gas containing a number of radicals generated by plasma in advance is supplied to the process filed, it immediately starts a combustion reaction with $H_2$ gas without delay. In this case, the oxidation rate on the wafer surface becomes more uniform between wafers and on each wafer surface. Further, the film formation rate and planar and inter-substrate uniformities in film thickness can be set at sufficiently high levels, without using a large amount of $H_2$ gas. Consequently, the hydrogen concentration in the film is decreased by that much, so film qualities, such as breakdown voltage and leakage current, are improved.

The oxidation process described above may be performed under the following process conditions, although these conditions are not limiting. Specifically, the process temperature is set to be within a range of from room temperature to 1,050° C., and preferably of 400° C. to 750° C. in light of the heat resistance of underlying devices. The process pressure is set to be less than 466 Pa (3.5 Torr). If the process pressure is not less than 466 Pa, the inter-substrate and planar uniformities of film thickness become undesirably too low. The flow rate of $O_2$ gas is set to be within a range of 1 sccm to 10 slm (standard liter per minute). The flow rate of $H_2$ gas is set to be within a range of 1 sccm to 5 slm. By use of these conditions, it is possible to improve the planar uniformity and film quality of the oxide film, while attaining a relative high oxidation rate.

<Experiment 1: Improvement of Oxidation Rate by $O_2$ Plasma>

As regards an oxidation method according to the embodiment described above, oxygen radicals derived from plasma was examined in terms of an influence on the oxidation rate. In a comparative example CE1, an oxidation process (without $O_2$ plasma) was performed by a conventional method using $O_2$ gas and $H_2$ gas. In a, present example PE1, an oxidation process (with $O_2$ plasma) was performed by a method according to the embodiment described above using $O_2$ gas and $H_2$ gas. This experiment employed process conditions including a process temperature of 850° C., a process pressure of 0.35 Torr, an $O_2$ gas flow rate of 2 slm, and a process time of 30 minutes.

Figure 4:
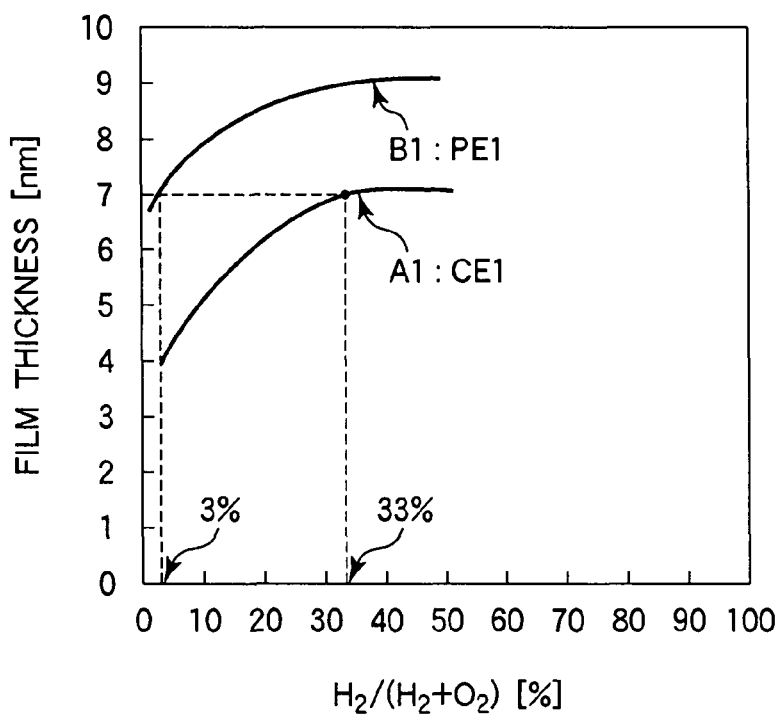
FIG. 4 is a graph showing the relationship between the film thickness and the ratio of the flow rate of hydrogen relative to the total gas flow rate of hydrogen and oxygen, in a comparative example CE1 and a present example PE1.

FIG. 4 is a graph showing the relationship between the film thickness and the ratio of the flow rate of hydrogen relative to the total gas flow rate of hydrogen and oxygen, in the comparative example CE1 and present example PE1. In the graph shown in FIG. 4, a line A1 indicates the characteristic of the comparative example CE1. A line B1 indicates the characteristic of the present example PE1. The horizontal axis denotes the ratio of the flow rate of $H_2$ gas relative to the total of $O_2$ gas and $H_2$ gas $[H_2/(H_2+O_2)]$.

As shown in FIG. 4, in the comparative example CE1, the film thickness reached a saturation point of about 7 nm when the ratio of the flow rate of $H_2$ gas was about 33%. In the present example PE1, the film thickness reached the same film thickness (film formation rate) when the ratio of the flow rate of $H_2$ gas was only about 3%. As indicated by the lines A1 and B1, the line B1 was shifted upward from the line A1 in parallel therewith as a whole. Accordingly, it was confirmed that the present example PE1 remarkably improved the film formation rate (oxidation rate) as a whole.

In other words, the present example PE1 can attain the same film formation rate as the comparative example CE1 even if the flow rate of $H_2$ gas is decreased. Hence, the hydrogen concentration in the film can be decreased by that much, thereby improving the film quality and property.

<Experiment 2: Suppression of Loading Effect by $O_2$ Plasma>

A simulation was performed of an influence of $O_2$ plasma on the loading effect. The loading effect is an effect as to how a surface state around a specific wafer changes the film formation rate (film thickness) on the specific wafer. In this experiment, the surface of wafers placed around the specific wafer was set to be different two film types, so as to check the effect of them on the film formation rate on the specific wafer. One of them was a film type ($SiO_2$) that did not consume radicals so much, and the other was a film type (Si) that consumed a large number of radicals.

Specifically, as a first group, 5 monitor wafers formed of silicon wafers having an exposed silicon surface were uniformly distributed in an array of 45 silicon wafers having a surface covered with a thin $SiO_2$ film. As a second group, as in the first group, 5 monitor wafers formed of silicon wafers having an exposed silicon surface were uniformly distributed in an array of 45 silicon wafers having an exposed silicon surface. The monitor wafers used in the first and second groups were essentially the same.

In a comparative example CE2, an oxidation process (without $O_2$ plasma) was performed by a conventional method using $O_2$ gas and $H_2$ gas on the wafers of the first group and second group. In a present example PE2, an oxidation process (with $O_2$ plasma) was performed by a method according to the embodiment described above using $O_2$ gas and $H_2$ gas on the wafers of the first group and second group. Then, the thickness of an $SiO_2$ film formed by oxidation on the surface of the monitor wafers was measured and the average value thereof was calculated. This experiment employed process conditions including a process temperature of 850° C., a process pressure of 0.35 Torr, an $O_2$ gas flow rate of 2 slm, an $H_2$ gas flow rate of 1 slm, and a process time of 30 minutes.

Figure 5:
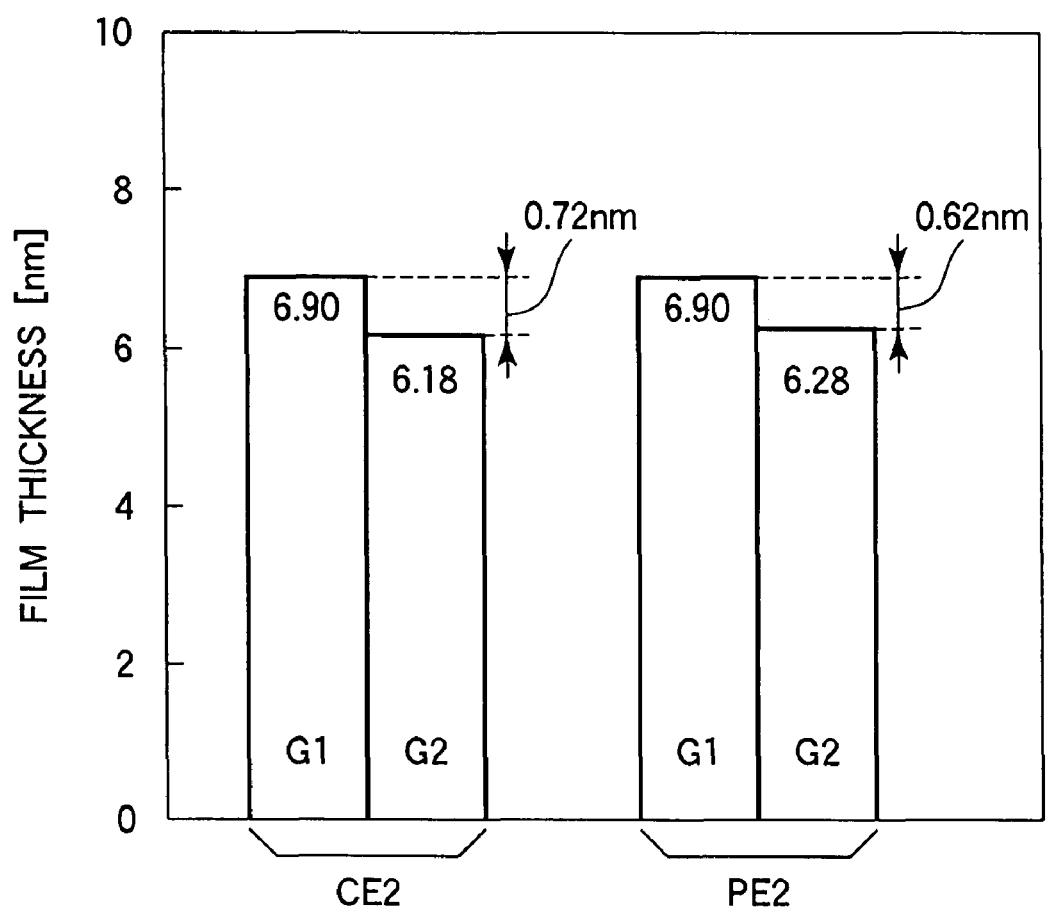
FIG. 5 is a graph showing measurement values of film thickness as the loading effect of a comparative example CE2 and a present example PE2.

FIG. 5 is a graph showing measurement values of the film thickness as the loading effect of the comparative example CE2 and present example PE2. As regards the first group G1, both of the comparative example CE2 and present example PE2 rendered an $SiO_2$ film thickness of 6.90 nm. It is thought that this was due to the fact that the monitor wafers were surrounded by wafers having a surface covered with an $SiO_2$ film in the first group G1. In this case, since the surrounding wafers did not consume radicals so much, the monitor wafers were supplied with a large number of radicals, which resulted in sufficient oxidation.

As regards the second group G2, the comparative example CE2 rendered an $SiO_2$ film thickness of 6.18 nm. The present example PE2 rendered an $SiO_2$ film thickness of 6.28 nm. It is thought that this was due to the fact that the monitor wafers were surrounded by wafers having an exposed silicon surface in the second group G2. In this case, since the surrounding wafers consumed a large number of radicals, the monitor wafers were supplied with a smaller number of radicals, which resulted in a lower oxidation rate.

In this respect, the comparative example CE2 rendered a decrease of 0.72 nm in film thickness, while the present example PE2 rendered a decrease of 0.62 nm in film thickness. Since the present example PE3 was arranged to generate oxygen radicals in advance, the decrease in film thickness become smaller by 0.1 nm (=0.72−0.62 nm), as compared with the comparative example CE3. This difference of 0.1 nm in film thickness is significant, because the practical standard currently used requires the film thickness to be controlled around a nanometer.

Further, where the oxidation is less affected by the film type of surrounding wafers or the like as described above, an advantage may be brought about in that adjustment of process conditions is unnecessary or decreased in amount, even where the pattern surface area and/or film type are changed as describe previously.

<Experiment 3: Contribution of $O_2$ Plasma to Ignition>

A simulation was performed of the contribution of $O_2$ plasma to the ignition of a combustion reaction. In a comparative example CE3, an oxidation process (without $O_2$ plasma) was performed by a conventional method using $O_2$ gas and $H_2$ gas. In present examples PE3A and PE3B, an oxidation process (with $O_2$ plasma) was performed by a method according to the embodiment described above using $O_2$ gas and $H_2$ gas, while setting the initial value of $O^*$ at 0.1% and 10%, respectively.

Figure 6:
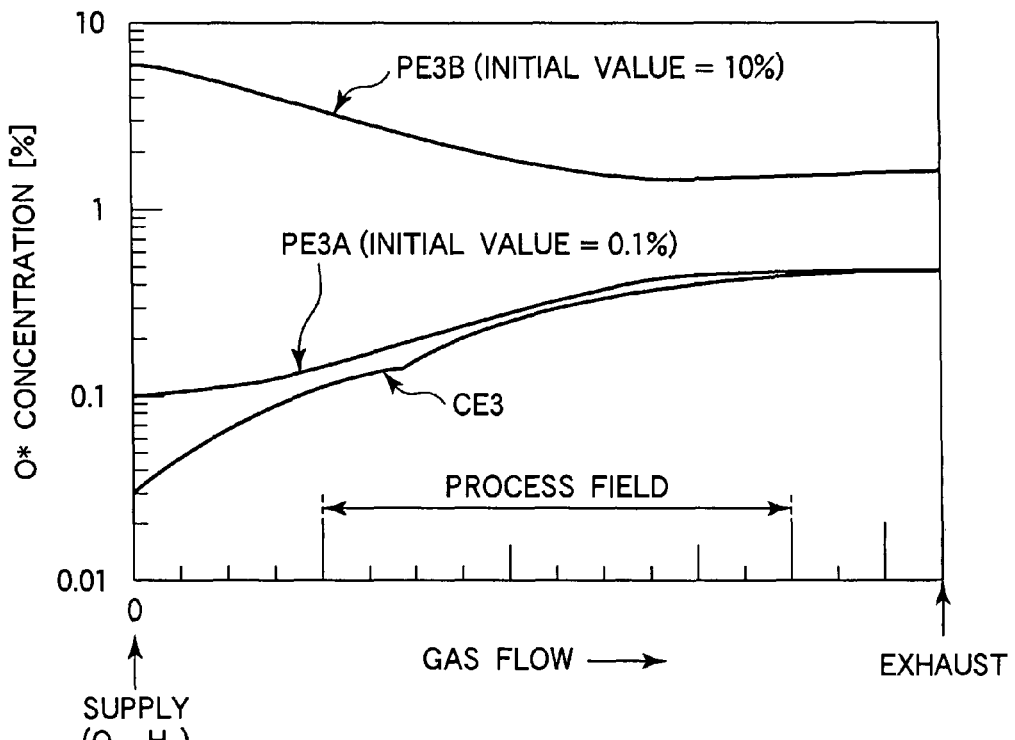
FIG. 6 is a graph showing change in concentration of oxygen radicals, in a comparative example CE3 and present examples PE3A and PE3B.

FIG. 6 is a graph showing change in concentration of oxygen radicals, in the comparative example CE3 and present examples PE3A and PE3B. In FIG. 6, the horizontal axis denotes the distance from the gas supply position toward the downstream side in the gas flow direction, in which the process filed is present. The vertical axis denotes the concentration of oxygen radicals. The horizontal axis can be applied not only to the embodiment described above in which the gases are horizontally supplied from one side of the process container and exhausted from the opposite side, but also to a case where gases flows in the vertical direction inside the process container, as described later.

As shown in FIG. 6, in the comparative example CE3, when $O_2$ gas and $H_2$ gas were supplied, a combustion reaction started after a while, and the concentration of oxygen radicals gradually increased. Eve after consumption of oxygen radicals started, the concentration still increased almost until the gases were exhausted. This means that the number of oxygen radicals generated by combustion was larger than consumption.

On the other hand, in the present example PE3A in which the initial value of oxygen radicals ($O^*$) was set at 0.1%, since oxygen was activated in advance, the area having no combustion was removed or narrowed. In this case, the concentration of oxygen radicals was relatively high at the supply position, and then gradually increased. However, halfway through the flow, the concentration rendered the same characteristic line as the comparative example CE3.

In the present example PE3B in which the initial value of oxygen radicals ($O^*$) was set at 10%, the concentration of oxygen radicals was very high, such as about 6%, at the supply position, and thus then gradually decreased. However, the concentration was stabilized at a higher level until the gases were exhausted, as compared with the comparative example CE3.

As described above, where the initial value of oxygen radicals (the initial supply concentration) was controlled to be within a range of, e.g., 0.1% to 10%, the concentration of oxygen radicals within the process filed can be flexibly controlled. In this respect, the initial value of oxygen radicals was set at 0.001% to examine the effect thereof, and resulted in the same characteristic line as the comparative example CE3.

<Decreased in Hydrogen Components in Film by $O_2$ Plasma>

Figure 7:
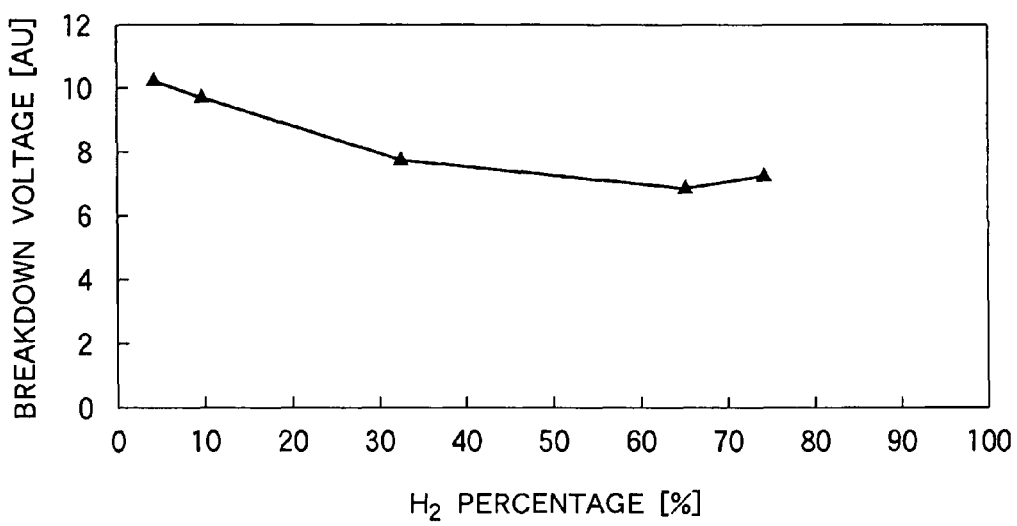
FIG. 7 is a graph showing the relationship between the breakdown voltage of an $SiO_2$ film and the $H_2$ percentage relative to the total gas flow rate.

Next, an explanation will be given of an influence of $O_2$ plasma on hydrogen components contained in a film. FIG. 7 is a graph showing the relationship between the breakdown voltage of an $SiO_2$ film and the $H_2$ percentage relative to the total gas flow rate. It is apparent that the breakdown voltage characteristic is improved with a decrease in $H_2$ percentage. Accordingly, as described with reference to FIG. 4, where $O_2$ plasma is supplied such that the $H_2$ percentage becomes lower, it is possible to provide an $SiO_2$ film with good film quality and property while maintaining a high oxidation rate.

Figure 8A:
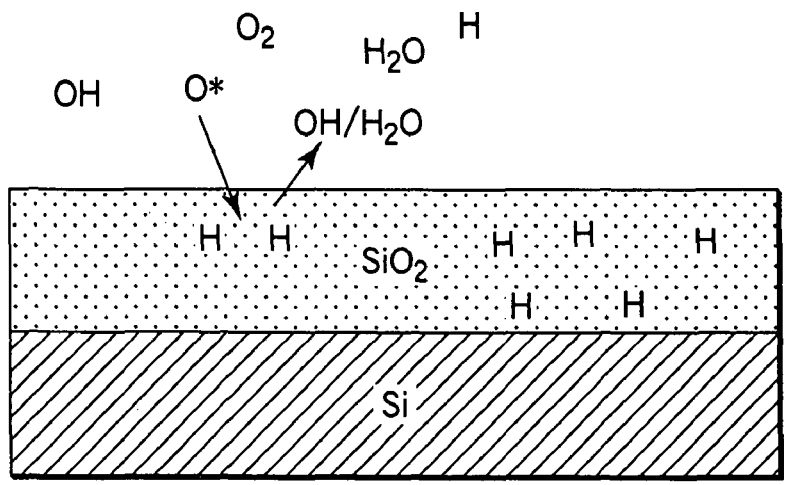
FIGS. 8A and 8B are views each schematically showing the state of an $SiO_2$ film from which hydrogen (H) components are being removed.
Figure 8B:
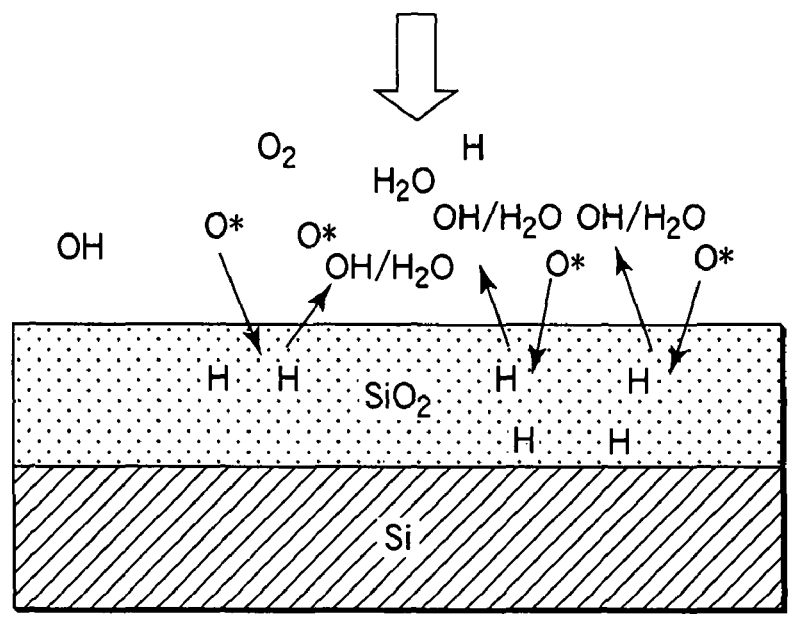

FIGS. 8A and 8B are views each schematically showing the state of an $SiO_2$ film from which hydrogen (H) components are being removed. FIG. 8A shows a conventional method in which the number of oxygen radicals ($O^*$) is small, while FIG. 8B shows a method according to the embodiment described above in which the number of oxygen radicals is larger. As shown in FIGS. 8A and 8B, oxygen radicals act to knock out hydrogen (H) components from the film as "OH" or "$H_2O$". Accordingly, as shown in FIG. 8B, with an increase in oxygen radicals, the hydrogen components in the film are decreased, so the hydrogen concentration in the film becomes lower.

Figure 9B:
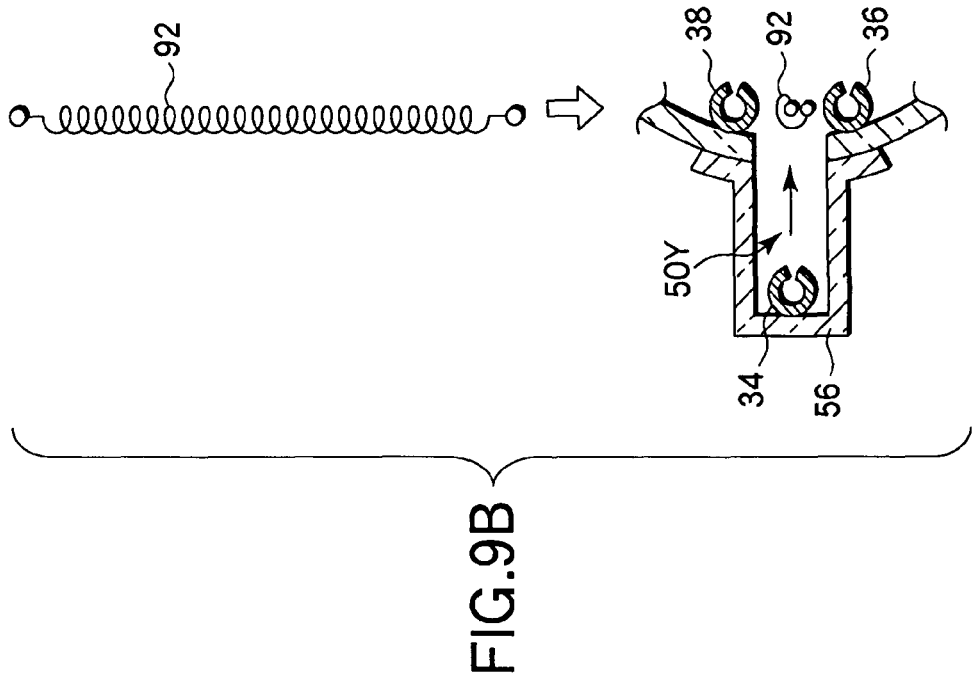
FIGS. 9A and 9B are views showing different modifications of a gas exciting section.
Figure 9A:
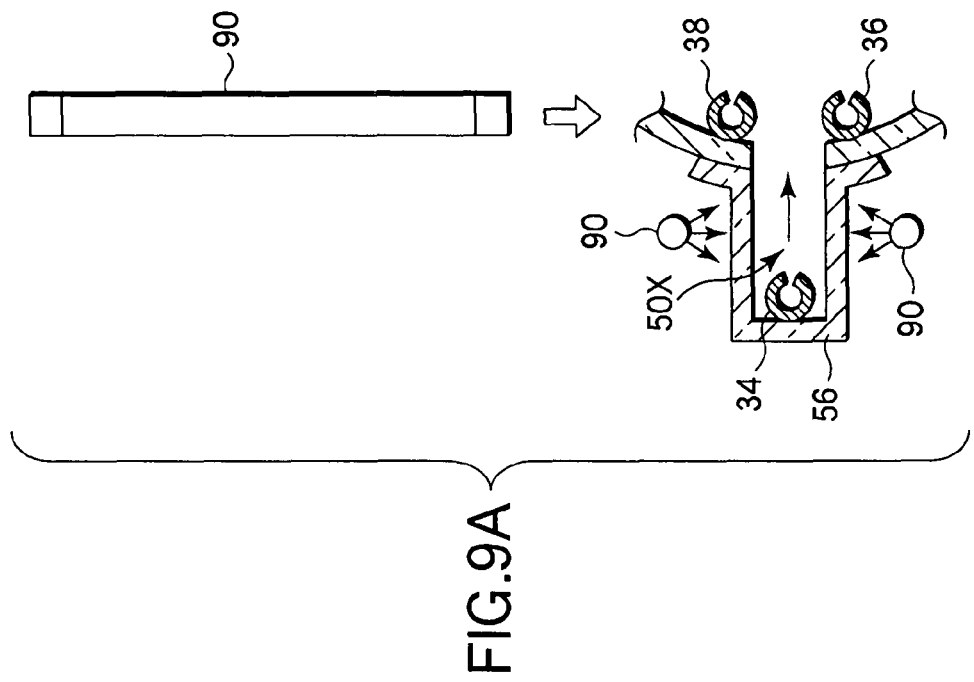

The embodiment described above is of the type in which a gas is activated by plasma generated by an RF (Radio Frequency) in the gas exciting section 50. However, in place of an RF, ultraviolet rays or a catalyst may be used, or a combination of two or more of an RF, ultraviolet rays, and a catalyst may be used. FIGS. 9A and 9B are views showing different modifications of a gas exciting section. Each of the modifications shown in FIGS. 9A and 9B can provide the same effect as the case using an RF described above.

Specifically, a gas exciting section 50X according to the modification shown in FIG. 9A includes an ultraviolet lamp 90 for emitting ultraviolet rays disposed outside an exciting section cover 56. Oxygen is activated to generate oxygen radicals by ultraviolet rays emitted from the ultraviolet lamp 90. The gas exciting section 50Y according to the modification shown in FIG. 9B includes a catalyst 92 disposed at the opening of the exciting section cover 56 and extending in the longitudinal direction thereof. Oxygen is activated to generate oxygen radicals by the catalyst 92. The catalyst may be a hot tungsten body, which is formed of, e.g., a spiral tungsten wire to be supplied with electricity and thereby heated.

Figure 10:
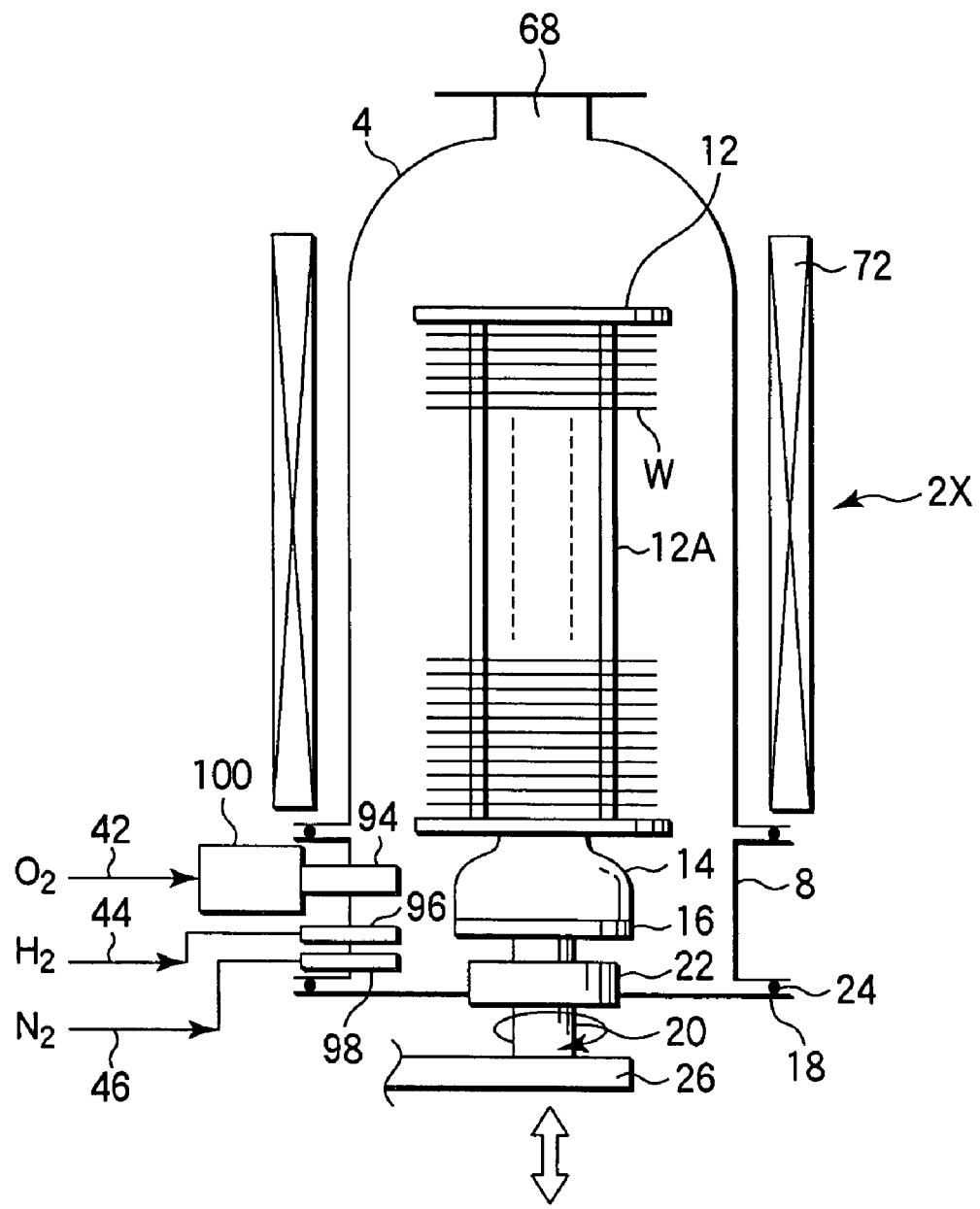
FIG. 10 is a view schematically showing a modification of the oxidation apparatus.

In the apparatus FIG. 1, the gas exciting section 50 is disposed on the sidewall of the process container 4, and a process gas is delivered from gas spouting holes in the horizontally direction, and is exhausted from the exhaust port 56 on the opposite side. In place of this structure, a process gas may be caused to flow downward from above or to flow upward from below inside the process container 4. FIG. 10 is a view schematically showing a modification of the oxidation apparatus. In FIG. 10, the constituent elements having substantially the same function and arrangement shown in FIG. 1 are denoted by the same reference numerals.

In the apparatus shown in FIG. 10, a process container 4 includes a manifold 8 on the bottom side, to which straight pipe nozzles 94, 96, and 98 are connected to supply $O_2$ gas, $H_2$ gas, and $N_2$ gas respectively. The nozzle 94 for $O_2$ gas is provided with, e.g., a plasma generator 100 as a gas exciting section 50, in which oxygen radicals are generated. Gases supplied into the process container 4 flow upward while causing a combustion reaction and coming into contact with the surface of wafers. This structure can also provide the same effect as the oxidation apparatus shown in FIG. 1.

The embodiments described above are arranged to activate only $O_2$ gas. However, for example, as show in FIG. 3, both of $O_2$ gas and $H_2$ gas may be activated. Alternatively, the structure shown in FIG. 2 may be modified to exchange the positions of the oxidizing gas nozzle 24 and deoxidizing gas nozzle 36 with each other to activate only $H_2$ gas. The embodiments described above are arranged to activate the oxidizing gas by a gas exciting section disposed upstream from the process filed 5. However, in place of providing such an upstream gas exciting section, the heater 72 may be controlled to set a suitable temperature for activating the oxidizing gas and deoxidizing gas up to a necessary level. In this case, the mechanism for exciting the process gases is formed only of the heater.

In the embodiments described above, the oxidizing gas is $O_2$ gas while the deoxidizing gas is $H_2$ gas, but this is not limiting. The oxidizing gas may be one or more gases selected from the group consisting of $O_2$, $N_2O$, $NO$, $NO_2$, and $O_3$. The deoxidizing gas may be one or more gases selected from the group consisting of $H_2$, $NH_3$, carbon hydride, HCl, $D_2$ (D indicates deuterium, hereinafter), $ND_3$, carbon deuterium, and DCl.

The embodiments described above are exemplified by a case where silicon is exposed on the surface of semiconductor wafers, but this is not limiting. The present invention may be applied to a case where oxidation is performed on a silicon oxide film, silicon nitridation film, metal film, metal oxide film, or metal nitridation film exposed on the surface. Where a silicon oxide film is present on the surface, the thickness of the silicon oxide film is increased by the oxidation.

The embodiments described above are exemplified by an oxidation apparatus of the batch type to process a plurality of wafers together at a time, but this is not limiting. The present invention may be applied to an oxidation apparatus of a single-wafer type to process wafers one by one.

The embodiments described above are exemplified by a case where the target substrate is a semiconductor wafer, but this is not limiting. The present invention may be applied to a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxidation method for a semiconductor process comprising:
    placing a plurality of target substrates at intervals in a vertical direction within a process field of a process container;
    supplying an oxidizing gas and a deoxidizing gas to the process field respectively through first and second gas supply ports disposed adjacent to the target substrates on one side of the process field, each of the first and second gas supply ports being present over a length corresponding to the process field in a vertical direction;
    turning the oxidizing gas into plasma by a gas exciting mechanism, thereby activating the oxidizing gas, while the oxidizing gas is being supplied, wherein the gas exciting mechanism excites the oxidizing gas by an electrode supplied with RF power and extending along a recess formed in the process container over a length corresponding to the process field in a vertical direction, and wherein the first gas supply port is present in the recess;
    exhausting gas from the process field through an exhaust port disposed opposite to the first and second gas supply ports with the process field interposed therebetween, thereby causing the oxidizing gas and the deoxidizing gas to flow along surfaces of the target substrates;
    causing the oxidizing gas and the deoxidizing gas to react with each other, thereby generating oxygen radicals and hydroxyl group radicals within the process field; and
    performing an oxidation process on the surfaces of the target substrate by use of the oxygen radicals and the hydroxyl group radicals.

2. The method according to claim 1, wherein the exhaust port is present over a length corresponding to the process field in a vertical direction.

3. The method according to claim 1, wherein the surfaces of the target substrate are defined by a silicon or silicon oxide layer.

4. The method according to claim 1, wherein the oxidation process is at a process pressure of 466 Pa (3.5 Torr) or less.

5. The method according to claim 1, wherein the oxidation process is at a process temperature from room temperature to 1,050° C.

6. The method according to claim 1, wherein the oxidizing gas comprises one or more gases selected from the group consisting of $O_2$, $N_2O$, $NO$, $NO_2$, and $O_3$.

7. The method according to claim 1, wherein the deoxidizing gas comprises one or more gases selected from the group consisting of $H_2$, $NH_3$, carbon hydride, HCl, $D_2$ (D indicates deuterium, hereinafter), $ND_3$, carbon deuterium, and DCl.

8. The method according to claim 1, wherein
the second gas supply port is present between the recess and the process field, and
only the oxidizing gas is turned into plasma by the gas exciting mechanism.

9. The method according to claim 1, wherein
the second gas supply port is present in the recess, and
both the oxidizing and deoxidizing gases are turned into plasma by the gas exciting mechanism.

10. The method according to claim 1, wherein the oxidizing gas is $O_2$ and the deoxidizing gas is $H_2$.

11. The method according to claim 1, wherein the oxidation process is at a temperature of 400 to 750° C. and a process pressure of 466 Pa (3.5 Torr) or less.

* * * * *